(12) United States Patent
Jang et al.

(10) Patent No.: US 7,586,150 B2
(45) Date of Patent: Sep. 8, 2009

(54) SEMICONDUCTOR DEVICES WITH LOCAL RECESS CHANNEL TRANSISTORS AND METHODS OF MANUFACTURING THE SAME

(75) Inventors: Se-myeong Jang, Gyeonggi-do (KR); Yong-chul Oh, Gyeonggi-do (KR); Makoto Yoshida, Gyeonggi-do (KR)

(73) Assignee: Samsung Electronic Co., Ltd. (KR)

( * ) Notice: Subject to any disclaimer, the term of this patent is extended or adjusted under 35 U.S.C. 154(b) by 428 days.

(21) Appl. No.: 11/211,378

(22) Filed: Aug. 25, 2005

(65) Prior Publication Data

US 2006/0049455 A1 Mar. 9, 2006

(30) Foreign Application Priority Data

Sep. 9, 2004 (KR) .................. 10-2004-0072109

(51) Int. Cl.
*H01L 29/94* (2006.01)

(52) U.S. Cl. .................. 257/330; 257/510; 257/332; 257/335; 257/151; 257/249; 257/314; 257/157; 257/158; 257/179; 257/257; 257/266; 257/574; 257/E21.205; 257/E21.624; 257/E21.638; 257/E21.403; 257/E21.455; 257/E21.623; 257/E21.637; 257/E21.176; 257/E21.186; 257/E21.374; 257/E21.458; 257/E21.621

(58) Field of Classification Search .................. 257/510, 257/330, 332

See application file for complete search history.

(56) References Cited

U.S. PATENT DOCUMENTS 5,471,075 A * 11/1995 Shekar et al. ................ 257/139

6,303,448 B1 10/2001 Chang et al. ................ 438/300
7,148,527 B2 * 12/2006 Kim et al. .................... 257/288
2002/0096725 A1 * 7/2002 Yoshihisa .................... 257/369
2005/0056886 A1 * 3/2005 Tihanyi ....................... 257/330
2005/0062101 A1 * 3/2005 Sugi et al. .................... 257/330

FOREIGN PATENT DOCUMENTS

| JP | 00244325 | 9/2001 |
| KR | 1020010059984 | 7/2001 |
| KR | 1020020044862 | 6/2002 |

* cited by examiner

*Primary Examiner*—Wael Fahmy
*Assistant Examiner*—Marc Armand
(74) *Attorney, Agent, or Firm*—Myers Bigel Sibley & Sajovec, P.A.

(57) ABSTRACT

A method of manufacturing a local recess channel transistor in a semiconductor device. A hard mask layer is formed on a semiconductor substrate that exposes a portion of the substrate. The exposed portion of the substrate is etched using the hard mask layer as an etch mask to form a recess trench. A trench spacer is formed on the substrate along a portion of sidewalls of the recess trench. The substrate along a lower portion of the recess trench is exposed after the trench spacer is formed. The exposed portion of the substrate along the lower portion of the recess trench is doped with a channel impurity to form a local channel impurity doped region surrounding the lower portion of the recess trench. A portion of the local channel impurity doped region surrounding the lower portion of the recess trench is doped with a $V_{th}$ adjusting impurity to form a $V_{th}$ adjusting impurity doped region inside the local channel impurity doped region. The width of the lower portion of the recess trench is expanded. A gate insulating layer is formed on the substrate in the recess trench. A gate electrode layer is formed on the gate insulating layer in the recess trench. A portion of the gate insulating layer and the gate electrode layer is etched to form a gate.

14 Claims, 9 Drawing Sheets

SEMICONDUCTOR DEVICES WITH LOCAL RECESS CHANNEL TRANSISTORS AND METHODS OF MANUFACTURING THE SAME

RELATED APPLICATION

This U.S. non-provisional patent application claims priority under 35 U.S.C. § 119 to Korean Patent Application No. 10-2004-0072109, filed on Sep. 9, 2004 in the Korean Intellectual Property Office, the disclosure of which is incorporated herein in its entirety by reference.

FIELD OF THE INVENTION

The present invention relates to semiconductor devices and, more particularly, to semiconductor devices with recess channel transistors and methods of manufacturing the same.

BACKGROUND OF THE INVENTION

As semiconductor devices become more highly integrated the dimensions of devices therein have necessarily decreased. For example, integration density has been increased by decreasing transistor feature sizes, including their gate length and channel length. Decreased channel length can result in a short channel effect, which can increase an off-current threshold of the transistors and can deteriorate refresh characteristics of memory devices having such transistors.

In an attempt to avoid such problems, a method of forming a recess channel in a semiconductor substrate has been introduced to extend the channel length of transistors. A semiconductor device with a conventional recess channel transistor array will now be described.

FIGS. 1A and 1B are cross sectional views of a semiconductor device with a conventional recess channel array transistor.

Referring to FIG. 1A, the semiconductor device includes recess channel transistors 181a and 181b. An active region is defined in a semiconductor substrate 100 by a device isolation region 105. The recess channel transistors 181a and 181b include gates 165a and 165b, respectively, a channel impurity doped region 130, and a threshold voltage ($V_{th}$) adjusting impurity doped region 150 in the semiconductor substrate 100. The gates 165a and 165b are formed by filling a recess trench 140 in the semiconductor substrate 100. The channel impurity doped region 130 contacts bottom portions of the gates 165a and 165b. A lightly doped region 175 and a source/drain region 170 are sequentially stacked next to the gates 165a and 165b of the recess transistors 181a and 181b. The lightly doped region 175 is connected to the channel impurity doped region 130.

The widths of gates 165a and 165b are different from each other. For example, as shown in FIGS. 1A-B gate 165b is wider than gate 165a. Therefore, the channel length of gate 165b is longer than that of gate 165a. Gate 165a includes a gate electrode layer 160a and a gate insulating layer 155a. Gate 165b similarly includes a gate electrode layer 160b and a gate insulating layer 155b. The gate insulating layers 155a and 155b are formed on a surface of the recess trench 140 in the semiconductor substrate 100 and on a portion of an upper surface of the semiconductor substrate 100. The gate electrode layers 160a and 160b can be formed from a metal, a doped silicon, or the like. The gate electrode layers 160a and 160b are formed on the gate insulating layers 155a and 155b, respectively, and fill the recess trenches 140 and protrude beyond an upper surface of the semiconductor substrate 100.

The recess transistors 181a and 181b are similar to a flat transistor, except that the channel impurity doped region 130 and the $V_{th}$-adjusting impurity doped region 150 are formed much lower in the semiconductor substrate 100 than those in a flat transistor. When a gate voltage that is greater than a threshold voltage is applied to the gates 165a and 165b of the recess transistors 181a and 181b, a recess channel is formed therefrom that has a different shape than the recess channel formed that is formed in the flat transistor. More particularly, the recess channel is formed along the curved lower surfaces of the gates 165a and 165b so that the recess channel has a rounded shape, which increases the effective channel length of the recess transistors 181a and 181b relative to the effective channel length in the flat transistor. The extended effective channel length can improve the static and dynamic refresh characteristics of a memory device that includes such transistors.

However, fabrication of very highly integrated semiconductor devices can necessitate the use of recess trenches with decreased widths and can limit the depth of the recesses used for the gates 165a and 165b formed in the semiconductor substrate 100. Accordingly, an effective length of the recess channel that is formed in the channel impurity doped region 130 can decrease. Use of relatively shallow trenches for the recess transistors 181a and 181b can cause variation in the depth and/or width of the recess of the gates 165a and 165b depending upon their location in the semiconductor 100. Such varying depths and/or widths can affect the length of the recess channels formed around lower portions of the gates 165a and 165b and can also affect the concentration of impurities in the threshold voltage impurity region 150 contacting the gates 165a and 165b. Variation in the recess channel lengths and the impurity concentrations between locations in the substrate 100 can cause the threshold voltage and leakage current to vary between transistors even when the recess transistors 181a and 181b have the same gate length. Accordingly, the refresh characteristics of associated memory cells in a memory device can vary across the substrate 100.

Referring to FIG. 1B, decreased gate length can increase an effect of substrate bias. For example, a ratio of a channel depletion region 190a of the recess transistor 181a formed on an edge of the gate 165a in which an electric field is strong relative to the entire depletion region can be greater than a ratio of a channel depletion region 190b of the recess transistor 181b relative to the entire depletion region. As substrate bias increases, the increase of the threshold voltage of the recess transistor 181a can become greater than that of the recess transistor 181b because the recess transistor 181a has a stronger electric field effect. Accordingly, it may be desirable to avoid any increase of such bias effect in the recess channel transistors 181a and 181b as gate length is decreased.

SUMMARY OF THE INVENTION

In some embodiments of the present invention, a semiconductor device includes a substrate with first and second local recess channel transistors thereon. The first and second local recess channel transistors each include source/drain regions, a recess trench in the substrate, a gate, and a local channel impurity doped region in the substrate. The recess trench is in the substrate between adjacent source/regions. The gate is in the recess trench and extends between a lower portion of the trench and an upper surface of the substrate. The local channel impurity doped region is in the substrate below and surrounding lower side portions of the gate in the lower portion of the recess trench. A common one of the source/drain regions is adjacent to and between the gates of the first and second local recess channel transistors. The local channel impurity doped region of the first local recess channel transistor is isolated from the local channel impurity doped region of the second local recess channel transistor.

In some further embodiments, the first and second local recess channel transistors can each further include a threshold voltage ($V_{th}$) adjusting impurity doped region inside the local channel impurity doped region of the substrate. The $V_{th}$ adjusting impurity doped region can have a higher impurity concentration than the local channel impurity doped region. The local channel impurity doped region can be doped with boron and the $V_{th}$ adjusting impurity doped region can be doped with $BF_2$.

In some further embodiments, the lower portion of the gate surrounded by the local channel impurity doped region can be wider than an upper portion of the gate. The gate can have a cylindrical upper portion and a spherical lower portion. The local channel impurity doped region can surround at least a portion of the spherical lower portion of the gate.

Some other embodiments provide a method of manufacturing a local recess channel transistor in a semiconductor device. A local channel impurity doped region is formed in a semiconductor substrate by doping the substrate with a channel impurity. A recess trench is formed in the substrate that exposes a portion of the local channel impurity doped region. A Vth adjusting impurity doped region is formed inside the local channel impurity doped region by doping a portion of the substrate along a bottom portion of the recess trench with a threshold voltage impurity. A gate insulating layer is formed on the substrate in the recess trench. A gate electrode layer is formed on the gate insulating layer in the recess trench. A gate is formed from the gate insulating layer and the gate electrode layer.

Some other embodiments provide another method of manufacturing a local recess channel transistor in a semiconductor device. A hard mask layer is formed on a semiconductor substrate that exposes a portion of the substrate. The exposed portion of the substrate is etched using the hard mask layer as an etch mask to form a recess trench. A trench spacer is formed on the substrate along a portion of sidewalls of the recess trench. The substrate along a lower portion of the recess trench is exposed after the trench spacer is formed. The exposed portion of the substrate along the lower portion of the recess trench is doped with a channel impurity to form a local channel impurity doped region surrounding the lower portion of the recess trench. A portion of the local channel impurity doped region surrounding the lower portion of the recess trench is doped with a $V_{th}$ adjusting impurity to form a $V_{th}$ adjusting impurity doped region inside the local channel impurity doped region. The width of the lower portion of the recess trench is expanded. A gate insulating layer is formed on the substrate in the recess trench. A gate electrode layer is formed on the gate insulating layer in the recess trench. A portion of the gate insulating layer and the gate electrode layer is etched to form a gate.

DETAILED DESCRIPTION OF EMBODIMENTS OF THE INVENTION

Figure 1A:
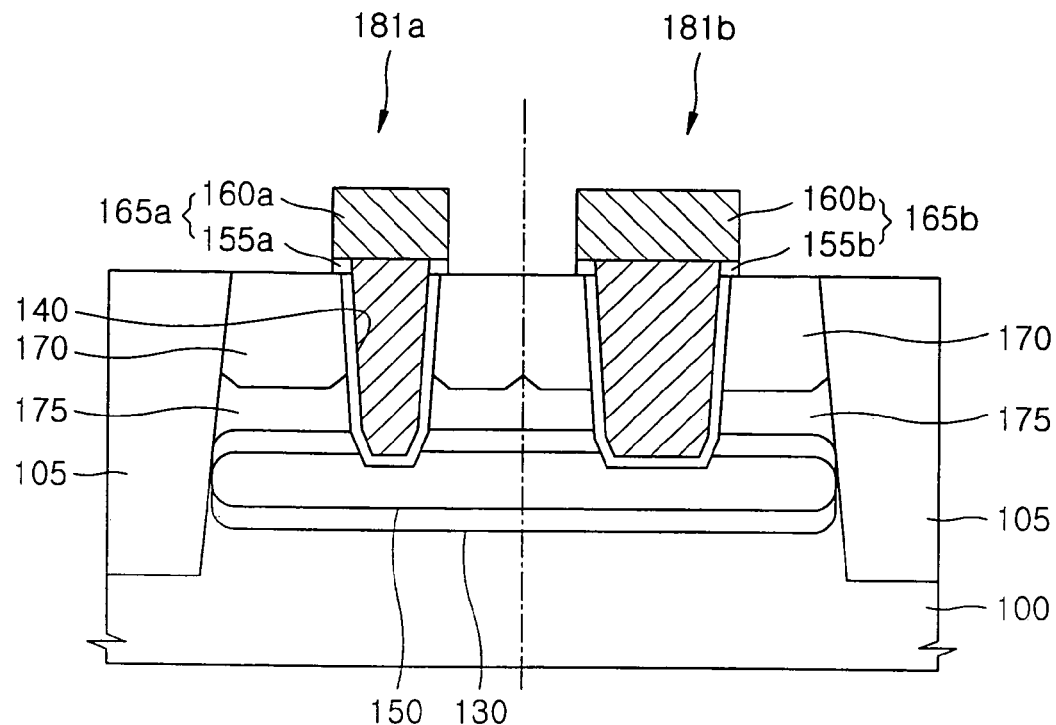
FIGS. 1A and 1B are cross sectional views of a semiconductor device that includes a conventional recess channel array transistor.

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the drawings.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
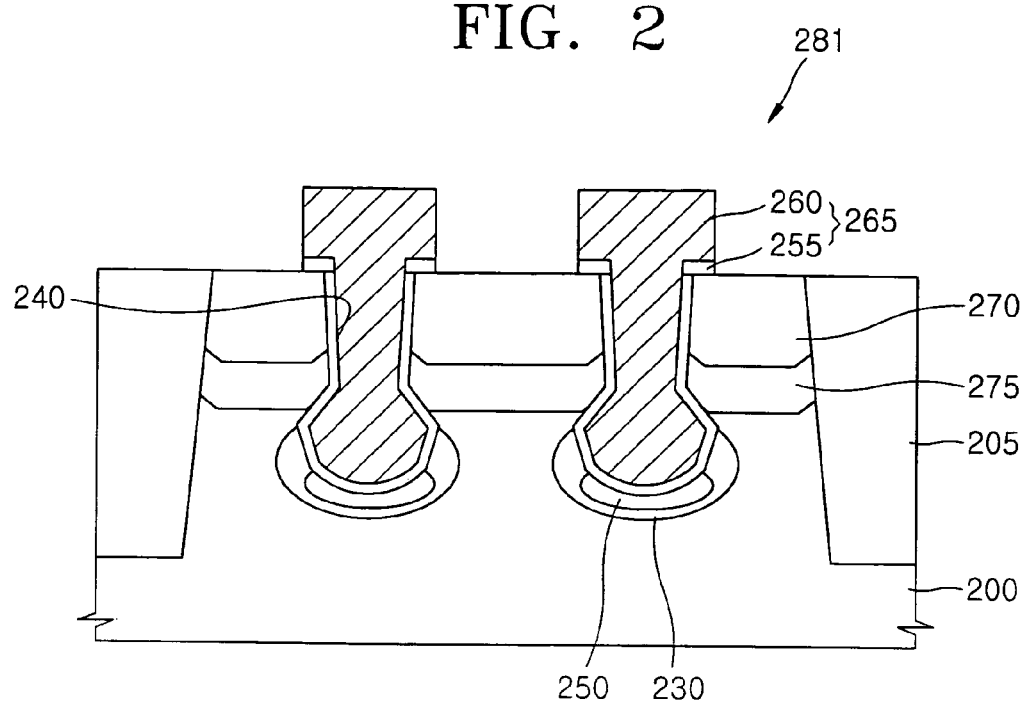
FIG. 2 is a cross sectional view of a semiconductor device that includes a local recess transistor according to some embodiments of the present invention.

FIG. 2 is a sectional view of a semiconductor device that includes a local recess transistor according to some embodiments of the present invention.

Referring to FIG. 2, the semiconductor device includes a local recess channel transistor 281. The local recess channel transistor 281 includes a gate 265, a local channel impurity doped region 230, and a threshold voltage ($V_{th}$) adjusting impurity doped region 250. A device isolation regions 205 are formed in a semiconductor substrate 200 to define an active region therebetween. The gate 265 is formed by filling a recess trench 240 formed in the active region of the substrate 200. The local channel impurity doped region 230 surrounds a lower portion of the gate 265. The $V_{th}$ adjusting impurity doped region 250 is formed inside the local channel impurity doped region 230.

A source/drain region 270 and a lightly doped region 275 are sequentially formed next to the gate 265 of the local recess transistor 281. The lightly doped region 275 is electrically connected to the local channel impurity doped region 230. The types of impurities doped into the source/drain region 270 and the lightly doped region 275 are different from the impurity type doped into the local channel impurity doped region 230. In addition, the concentration of an impurity of the $V_{th}$ adjusting impurity doped region 250 may be greater than a concentration of an impurity of the local channel impurity doped region 230 to control a threshold voltage of the local recess channel transistor 281. For example, when the local recess channel transistor 281 is an n-channel transistor, the local channel impurity doped region 230 may be doped with boron (B), and the $V_{th}$ adjusting impurity doped region 250 may be doped with B or $BF_2$.

The gate 265 includes a gate electrode layer 260 and a gate insulating layer 255. The gate electrode layer 260 can be formed from a metal, a doped polysilicon, or the like. The gate insulating layer 255 may be formed from a silicon oxide layer, a silicon nitride layer, and/or metal oxide layer. The portion of the gate 265 that extends into the substrate 200 may have a cylindrical upper portion and a generally spherical (e.g., rounded) shaped lower portion. The spherical lower portion of the gate 265 has a greater width than the cylindrical upper portion, which may increase an effective channel length of the local recess channel transistor 281. An upper portion of the gate 265 can protrude from an upper surface of the semiconductor substrate 200, or it may be planarized so that an upper surface of the gate 265 lies in the same plane as an upper surface of the semiconductor substrate 200.

Figure 1B:
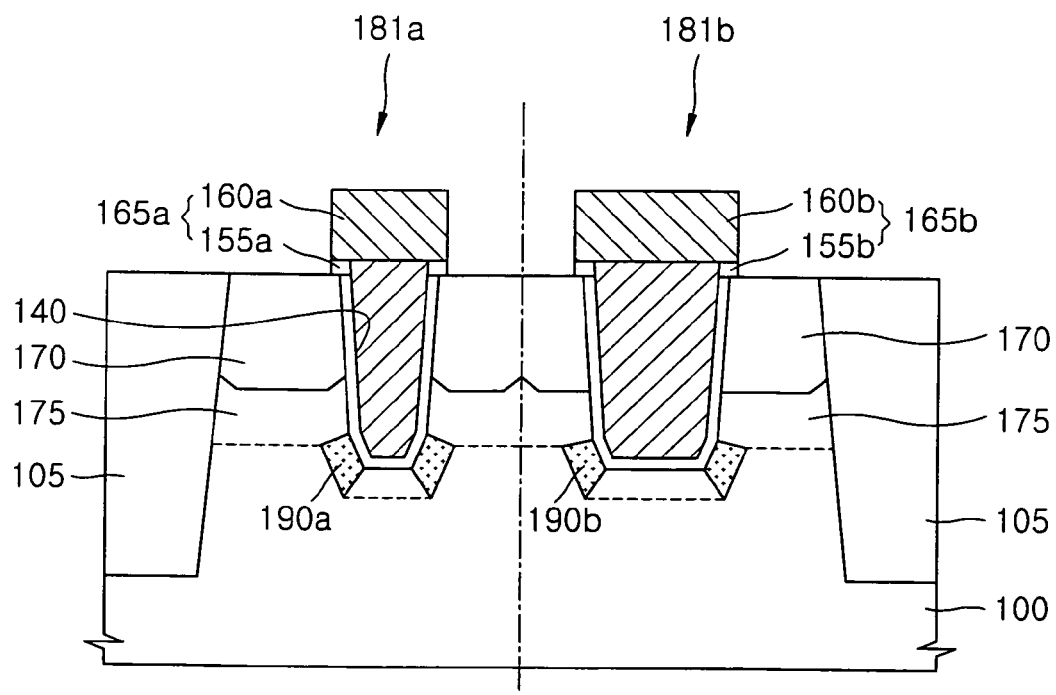

At least a portion of the spherical lower portion of the gate 265 of the local recess channel transistor 281 is surrounded by the local channel impurity doped region 230 and the $V_{th}$ adjusting impurity doped region 250. The local channel impurity doped region 230 and the $V_{th}$ adjusting impurity doped region 250 of adjacent ones of the local recess channel transistors 281 that share a source/drain region 270 can be isolated and separate from one another. For example, as shown in FIG. 2 the two adjacent transistors 281 share a common one of the source/drain regions 270 that is adjacent to and between the gates 265 of the two transistors 281, however, their respective local channel impurity doped regions 230 are isolated from one another and their $V_{th}$ adjusting impurity doped regions 250 are isolated from one another. The local channel impurity doped region 230 is thereby different from the conventional channel impurity doped region 130 shown in FIGS. 1A-B which is shared by the recess channel transistors 181a-b which have a common source/drain region 170 between their gates 165a-b.

Because the local channel impurity doped region 230 and the $V_{th}$ adjusting impurity doped region 250 are formed separately around individual ones of the gates of the local recess channel transistors 281, variation in the recessed depths of the gates 265 in the substrate 200 may not cause a variation in the impurity concentration in the $V_{th}$ adjusting impurity doped region 250 around the spherical lower portion of the gate 265, and may provide a relatively constant threshold voltage for the associated local recess channel transistors 281. In contrast, in the conventional recess channel transistors 181a-b of FIGS. 1A-B a variation in gate recess depth and/or width may cause variation in impurity concentration in the threshold voltage impurity region 150 around the lower portion of the gates 165 and associated variation in the threshold voltages of the transistors 181a-b.

Moreover, the spherical lower portion of the gate 265 of the local recess channel transistor 281 may form a larger effective channel length than that formed by the conventional channel transistors 181a-b which have cylindrical gates 165a-b. Accordingly, the refresh characteristics of a memory device that includes the local recess channel transistor 281 of FIG. 2 may be improved over one that includes the recess channel transistors 181a-b of FIG. 1. The local recess channel transistor 281 can have a lower edge portion of the local channel impurity doped region 230 in which an electric field is strong, and which may decrease a semiconductor bias effect on the threshold voltage.

Because the local channel impurity doped region 230 is separately and independently formed for each of the local recess channel transistors 281, the threshold voltage may be constant across a plurality of the transistors 281 irrespective of variation in the recessed depths and/or widths of the gates 265. Moreover, the lower portion of the gate 265 is curved to increase an effective channel length. As a result, the refresh characteristics of an associated memory device may improve.

FIGS. 3A through 3I are cross sectional views of a semiconductor device that includes a local recess transistor and methods of manufacturing the same according to some embodiments of the present invention.

Figure 3A:
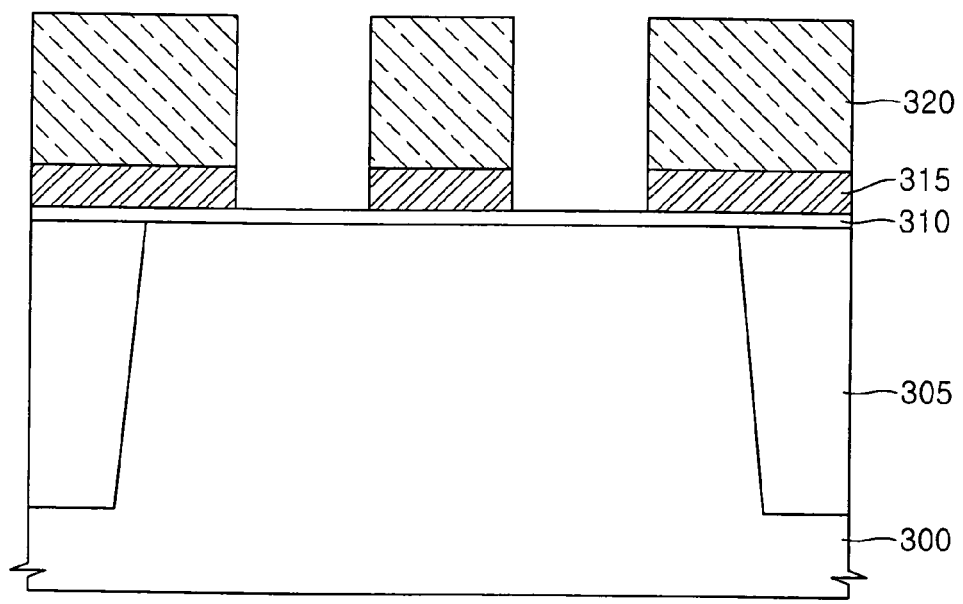
FIGS. 3A through 3I are cross sectional views of a semiconductor device that includes a local recess transistor and associated methods of manufacturing the same according to some embodiments of the present invention.
Figure 3B:
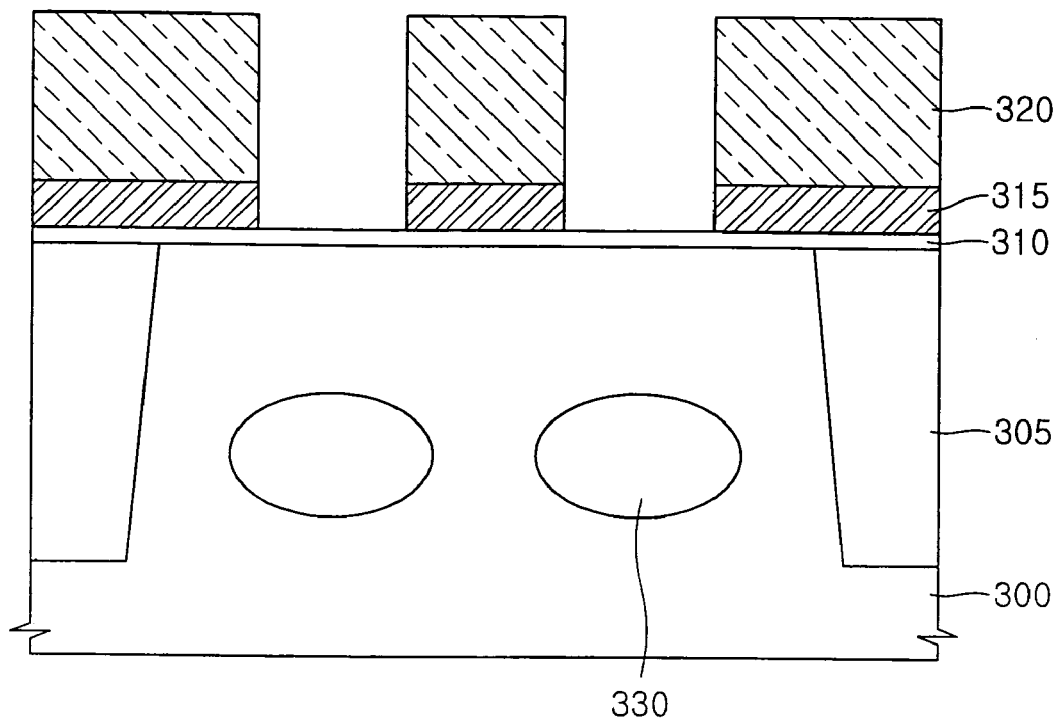

Referring to FIG. 3A, a buffer layer 310 and a hard mask layer 315 are sequentially formed on a semiconductor substrate 300 in which a device isolation region 305 is formed. A photoresist layer pattern 320 is formed on the hard mask layer 315. The buffer layer 310 may be formed from an oxide to decrease stress between the semiconductor substrate 300 and the hard mask layer 315. Alternatively, the buffer layer 310 can be formed by thermally oxidizing the semiconductor substrate 300 or by chemical vapor deposition (CVD). The hard mask layer 315 may be formed from a material having a low etch selectivity with respect to an oxide, such as a nitride or an oxide nitride. The hard mask layer 315 can be formed using CVD. The photoresist layer pattern 320 can be formed using a common photolithograpy technique after a photoresist layer is spin-coated. The photoresist layer pattern 320 exposes a portion of the hard mask layer 315 in which a recess trench is to be formed.

Subsequently, the hard mask layer 315 is etched using the photoresist layer pattern 320 as an etch mask to expose a portion of the buffer layer 310.

Referring to 3B, a channel impurity is ion-implanted into a portion of the semiconductor substrate 300 through the buffer layer 310 to form local channel impurity doped regions 330. The photoresist layer pattern 320 and the hard mask layer 315 are used as an ion implantation mask. Therefore, the local channel impurity doped regions 330 are formed separately in the regions between the photoresist layer pattern 320 and the hard mask layer 315 and below a region of the semiconductor substrate 300 in which the recess trenches will be formed.

Figure 3C:
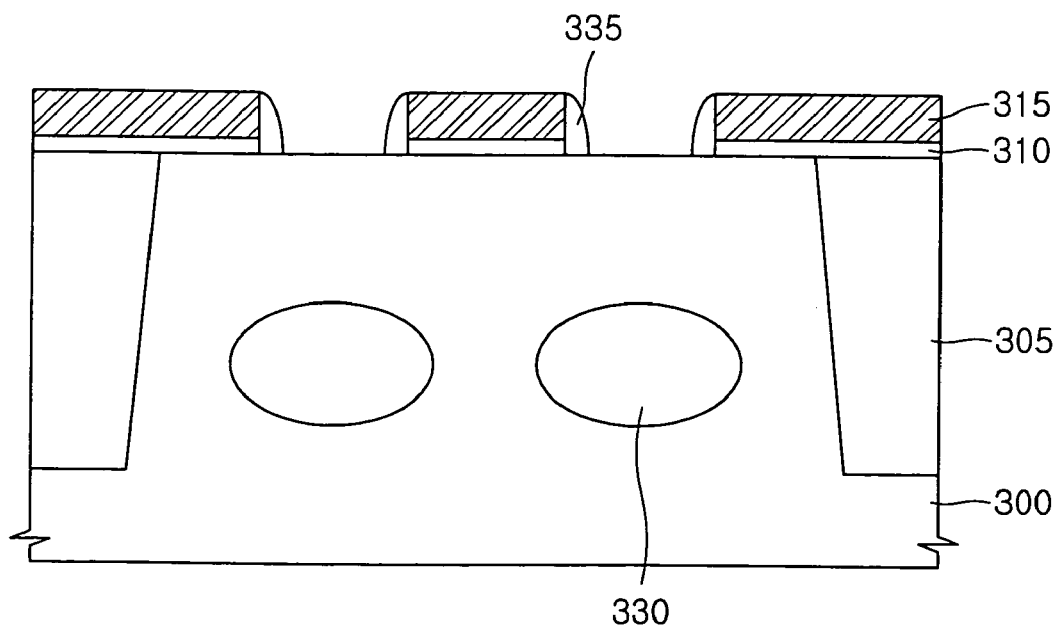

Referring to FIG. 3C, after the photoresist layer pattern 320 is removed, a portion of the buffer layer 310 exposed by the hard mask layer 315 is removed, thereby exposing a portion of the semiconductor substrate 300 above the local channel impurity doped region 330.

An insulating spacer 335 is formed on sidewalls of the buffer layer 310 and the hard mask layer 315. The insulating spacer 335 may be formed by anisotropically etching an oxide layer. The width of a portion of the semiconductor substrate 300 exposed by the buffer layer 310 and the hard mask layer 315 is decreased by the insulating spacer 335. Therefore, the insulating spacer 335 may be used to compensate for limitations on the pattern width due to associated limitations of utilized photolithography equipment and to increase a photolithography margin with respect to the width of the recess trench that will be formed.

Figure 3D:
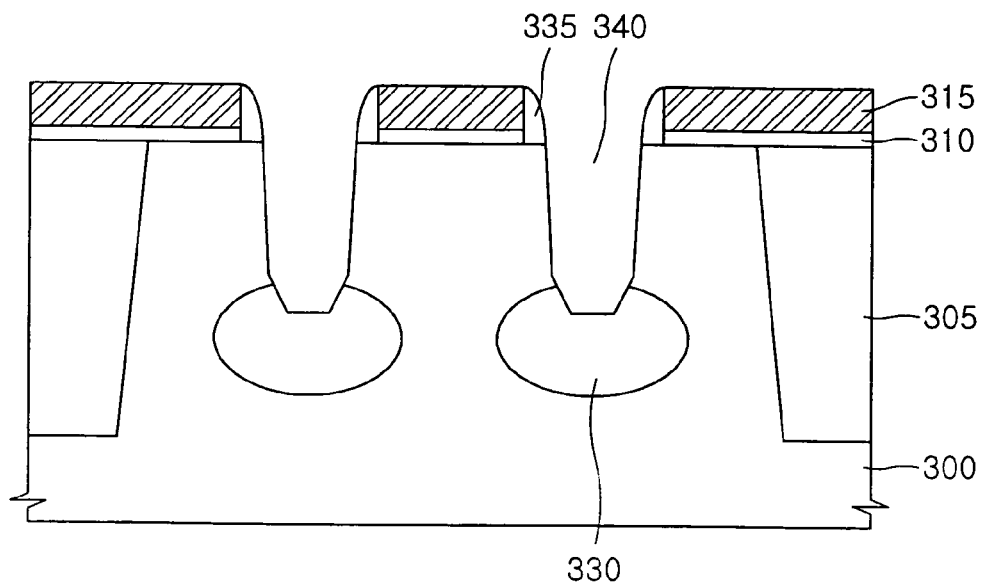

Referring to FIG. 3D, the semiconductor substrate 300 is etched using the buffer layer 310, the hard mask layer 315, and the insulating spacer 335 as an etch mask to form a recess trench 340 that exposes a portion of the local channel impurity doped region 330.

Figure 3E:
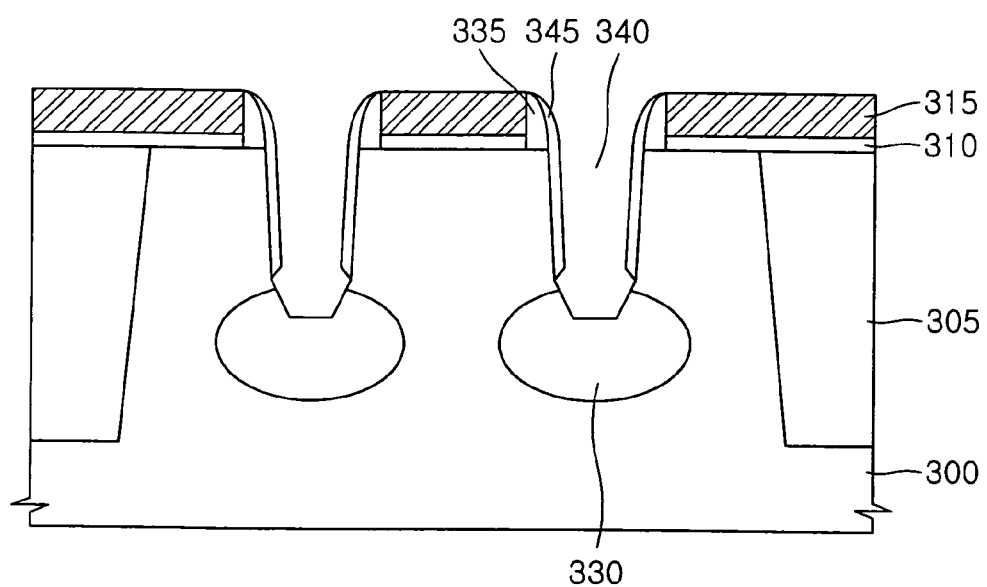

Referring to FIG. 3E, a trench spacer 345 can be formed on sidewalls of the recess trench 340. To form the trench spacer 345, the semiconductor substrate 300 exposed by the recess trench 340 can be thermally oxidized to form an oxide layer, and the oxide layer can be anisotropically etched to form the trench spacer 345. Alternatively, the semiconductor substrate 300 may be subjected to CVD to form a medium temperature oxide (MTO) layer, and then the MTO layer can be anisotropically etched to form the trench spacer 345. The trench spacer 345 may extend almost to the local channel impurity doped region 330, leaving uncovered only the semiconductor substrate 300 along a lower portion of the recess trench 340 within the local channel impurity doped region 330.

Figure 3F:
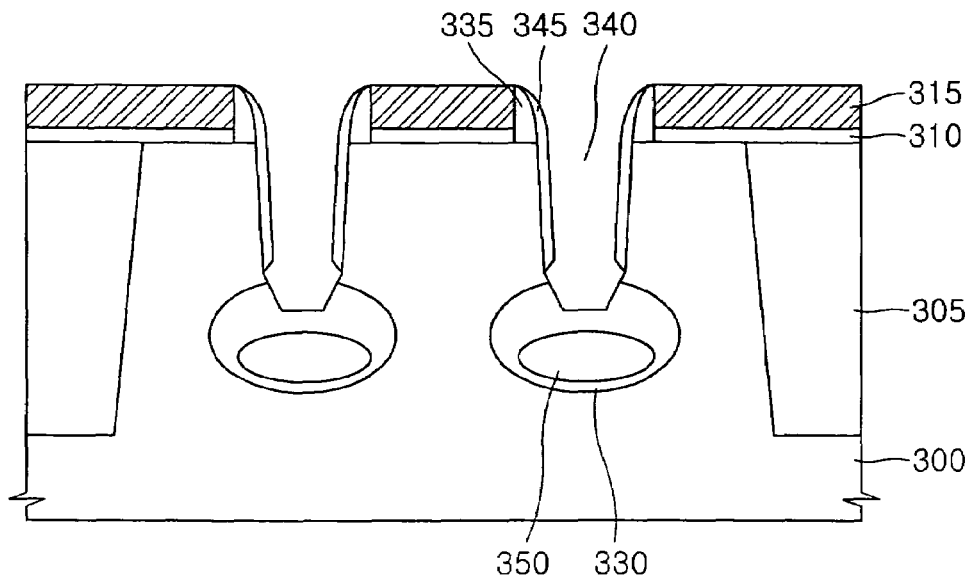

Referring to FIG. 3F, the semiconductor substrate 300 along the lower portion of the recess trench 340 is ion-implanted to form a $V_{th}$-adjusting impurity doped region 350. The $V_{th}$ adjusting impurity doped region 350 is formed inside the local channel impurity doped region 330. The $V_{th}$ adjusting impurity doped region 350 has a higher impurity concentration than the local channel impurity doped region 330.

When an n channel transistor is formed in the recess trench 340, the local channel impurity doped region 330 may be formed by ion-implantation with boron (B), and the $V_{th}$ adjusting impurity doped region 350 may be formed by ion-implantation with $BF_2$. In this case, the hard mask layer 315 formed over the semiconductor substrate 300 protects a portion of the semiconductor substrate 300 in which a source/drain region will be formed from the ion implantation.

Therefore, even when a depth of the recess trench 340 varies due to, for example, non-uniformity of etching equipment, the $V_{th}$ adjusting impurity doped region 350 can be formed at a predetermined depth below the lower portion of the recess trench 340 because threshold voltage impurity ions are implanted through the semiconductor substrate 300 exposed at the lower portion of the recess trench 340. As a result, doping concentrations of all channel regions may be equally formed, resulting in a constant threshold voltage of associated transistors.

Figure 3G:
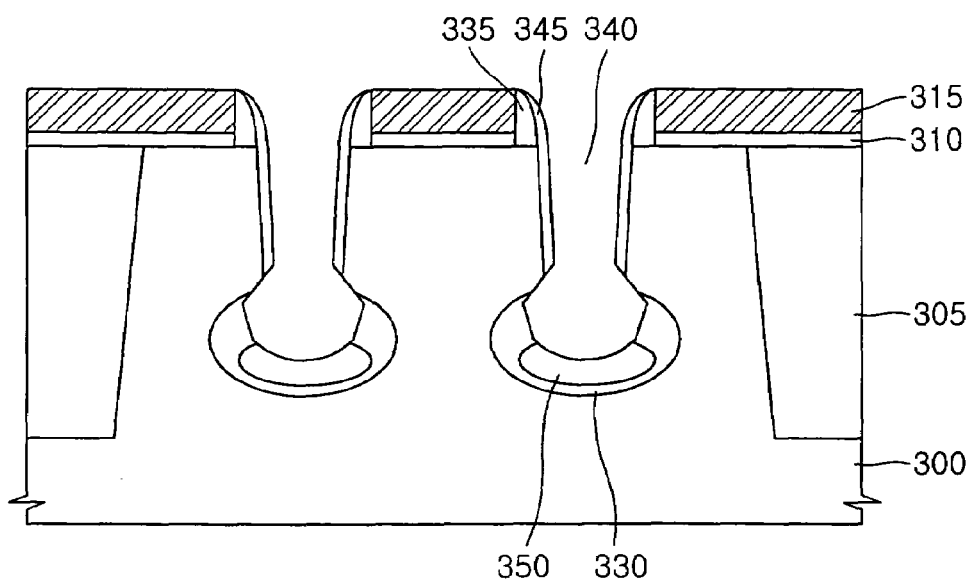

Referring to FIG. 3G, the semiconductor substrate 300 exposed along the lower portion of the recess trench 340 is isotropically etched to widen and round the lower portion of the recess trench 340, while using the trench spacer 345 as a etching mask.

During the isotropic etching, the semiconductor substrate 300 exposed at the lower portion of the recess trench 340 may be wet etched using an SC1 solution, which may be prepared by mixing $NH_4OH$, $H_2O_2$, and $H_2O$. The use of the SC1 solution may allow only etching of the semiconductor substrate 300 exposed at the lower portion of the recess trench 340. Alternatively, chemical dry etching (CDE) can be performed using, for example, radicals of $CF_4$ and $O_2$. Before the isotropic etching, the lower portion of the recess trench 340 is narrow and linearly sloped. After the isotropic etching, a lower portion of the recess trench 340 is wider and curved. The isotropic etching may be performed until the $V_{th}$ adjusting impurity doped region 350 is partially exposed. In addition, the isotropic etching may further include heating to round the surface of the semiconductor substrate 300 exposed by the lower portion of the recess trench 340. The heating may be performed in a hydrogen gas atmosphere.

Alternatively, the isotopic etching can be performed without additional photolithography. That is, the lower portion of the recess trench 340 is isotropically etched and expanded using the trench spacer 345 as an etch mask. Therefore, the effective channel length of the recess channel transistor can be increased with low manufacturing costs while satisfying feature sizes requirements for highly integrated devices.

Figure 3H:
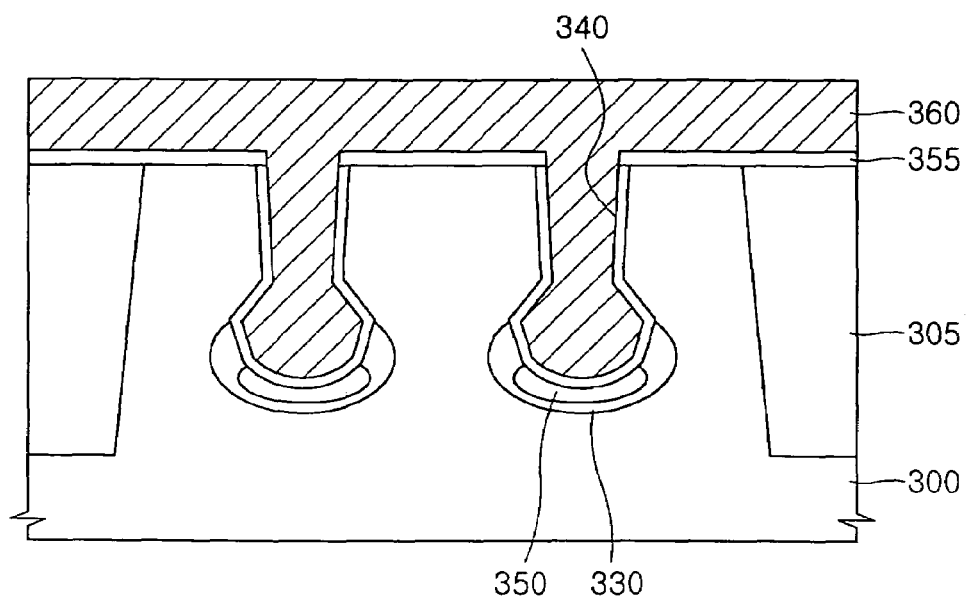

Subsequently, referring to FIG. 3H, the trench spacer 345, the insulating spacer 335, the hard mask layer 315, and the buffer layer 310 are removed to expose the semiconductor substrate 300 and the device isolation region 305. The trench spacer 345, the insulating spacer 335, and the buffer layer 310 can be oxide layers. Thus, the trench spacer 345, the insulating spacer 335, and the buffer layer 310 can be removed using a diluted fluoric acid or a buffered oxide etchant (BOE) solution. In addition, the hard mask layer 315 is a nitride layer. Thus, the hard mask layer 315 can be removed using a phosphoric acid solution.

Then, a gate insulating layer 355 is formed on the semiconductor substrate 300 and the device isolation region 305, and along the surface of the recess trench 340. Then, a gate electrode layer 360 is formed on the gate insulating layer 355, filling the recess trench 340, and can then be planarized. The gate insulating layer 355 may be formed using CVD. The gate insulating layer 355 may be an oxide layer, a nitride layer, and/or a metal oxide layer. Alternatively, the gate insulating layer 355 may be formed by thermally oxidizing the semiconductor substrate 300, in which case, the gate insulating layer 355 may not be formed on the device isolation region 305. The gate electrode layer 360 may be a polysilicon layer that is doped with a conductive dopant to have conducting characteristics, a metal layer, or a composite layer of these. In addition, the gate electrode layer 360 may be planarized using etch-back planaization or chemical mechanical polishing (CMP).

Figure 3I:
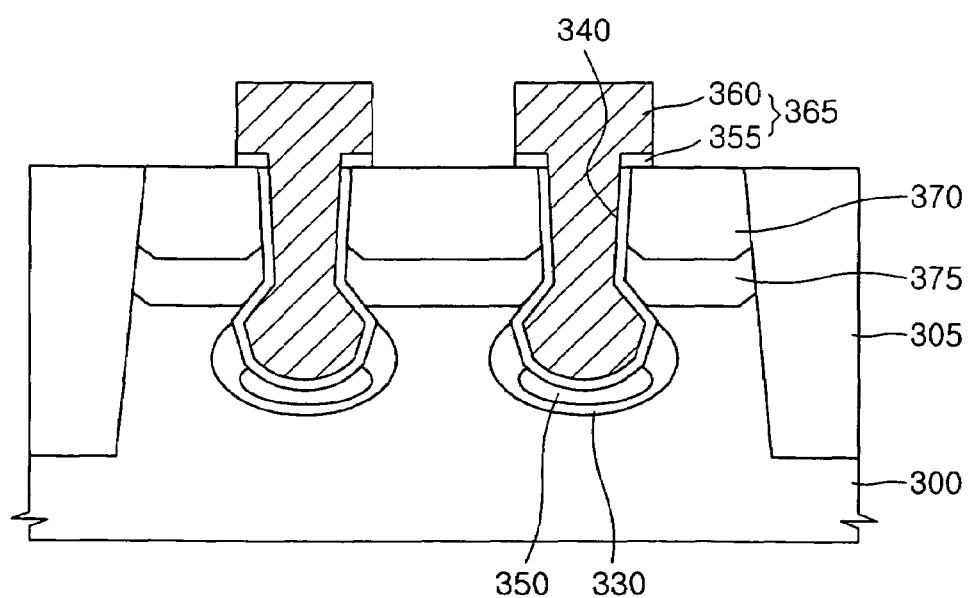

Referring to FIG. 3I, the gate insulating layer 355 and the gate electrode layer 360 are patterned to form a gate 365. The gate 365 fills the recess trench 340, and protrudes above an upper surface the semiconductor substrate 300. Alternatively, the gate insulating layer 355 and the gate electrode layer 360 can be planarized without a photolithograpy process to form the gate 365. In this case, an upper portion of the gate 365 does not protrude from the semiconductor substrate 300. In other words, an upper surface of the gate 365 lies in the same plane as the upper surface of the semiconductor substrate 300.

Subsequently, portions of the semiconductor substrate 300 next to the gate 365 are ion-implanted to sequentially form a lightly doped region 375 and a source/drain region 370. Then, a storage device such as a capacitor, and a metal interconnection layer may be formed thereon to produce a memory device according to conventional methods, which have not been shown in the figures.

According to an embodiment of the present invention, the local channel impurity doped region 330 and the $V_{th}$ adjusting impurity doped region 350 are separately formed for each transistor and isolated between transistors so local recess channels can be formed. Therefore, threshold voltages of the transistors can be constant even when the recess trenches 340 have varying depths. In addition, without an additional photolithography process, the lower portion of the recess trench 340 may be isotropically etched using the trench spacer 345 as an etch mask. In this case, the effective channel length may be increased while allowing for lower manufacturing costs and use of transistors having sufficiently small feature sizes to allow for fabrication of a highly integrated device.

FIGS. 4A through 4F are cross sectional views of a local recess channel transistor and methods of manufacturing the same according to some other embodiments of the present invention. The present methods are the same as the methods described with regard to FIGS. 3A-I, except that a local channel impurity doped region and a $V_{th}$ adjusting impurity doped region are sequentially formed after a recess trench is formed. More particularly, in the methods shown in FIGS. 3A-I a local channel impurity doped region is formed using a mask that is also used to form a recess trench, the recess trench is then formed, and then a $V_{th}$ adjusting impurity doped region is formed. In contrast, in the methods shown in FIGS. 4A-F, a recessed is formed and then a local channel impurity doped region and a $V_{th}$ adjusting impurity doped region are sequentially formed. Accordingly, some of the operations of the methods of FIGS. 4A-F are the same those described with regard to FIGS. 3A-I and like reference numerals in related figures denote like elements in the two methods.

Figure 4A:
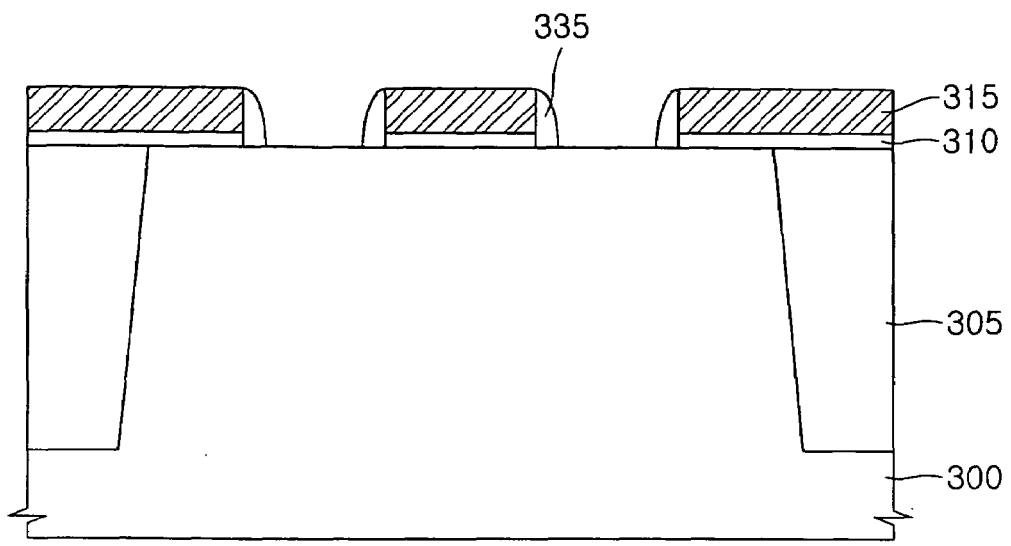
FIGS. 4A through 4F are cross sectional views of a semiconductor device that includes a local recess transistor and methods of manufacturing the same according to some other embodiments of the present invention.

Referring to FIG. 4A, a buffer layer 310 and a hard mask layer 315 are formed on a semiconductor substrate 300 exposing a portion of the semiconductor substrate 300 in which a recess trench 340 will be formed. An insulating spacer 335 is formed on sidewalls of the buffer layer 310 and the hard mask layer 315. The buffer layer 310, the hard mask layer 315, and the insulating spacer 335 leave exposed a portion of the semiconductor substrate 300 in which a recess trench 340 will be formed are described above with reference to FIGS. 3A through 3C.

Figure 4B:
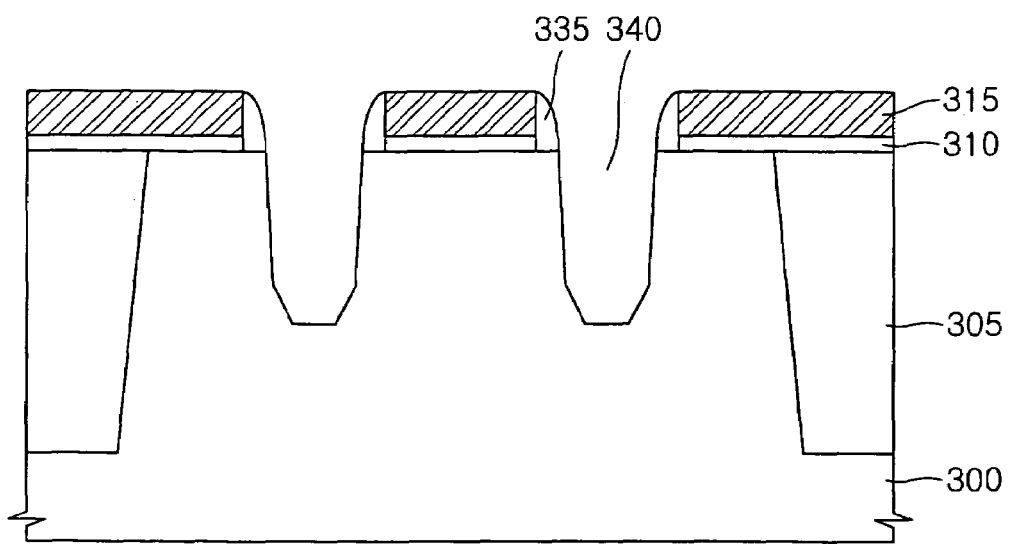

Referring to FIG. 4B, the semiconductor substrate 300 is etched to form the recess trench 340 using the hard mask layer 315 and the insulating spacer 335 as an etch mask.

Figure 4C:
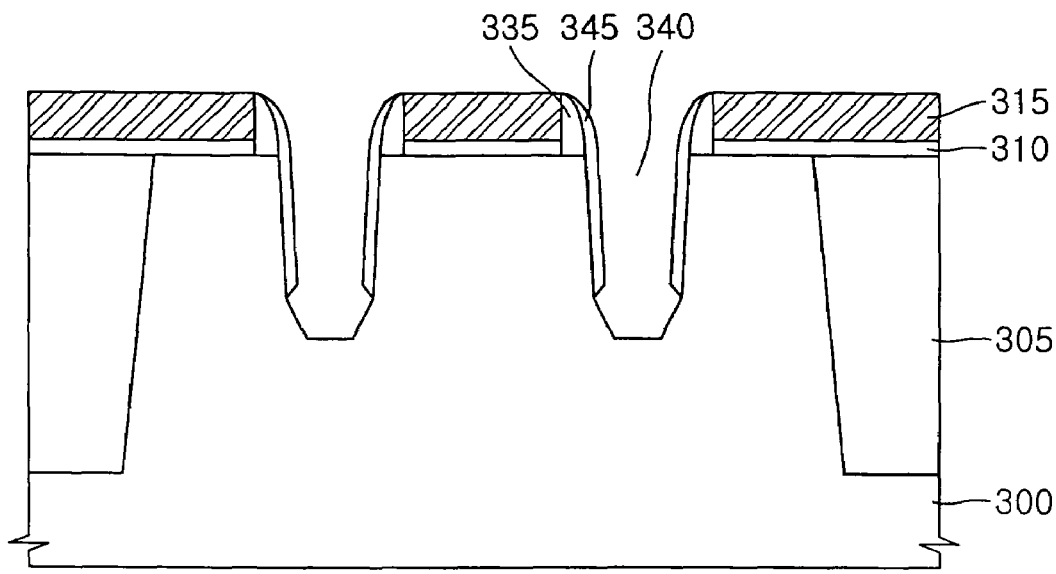

Referring to FIG. 4C, a trench spacer 345 is formed on sidewalls of the recess trench 340. To form the trench spacer 345, an oxide layer can be deposited on a surface of the recess trench 340 using CVD, and then anisotropically etched. The trench spacer 345 may extend to a location where a local channel impurity doped region 380 is to be formed, exposing a portion of the semiconductor substrate 300 along a lower portion of the recess trench 340.

Figure 4D:
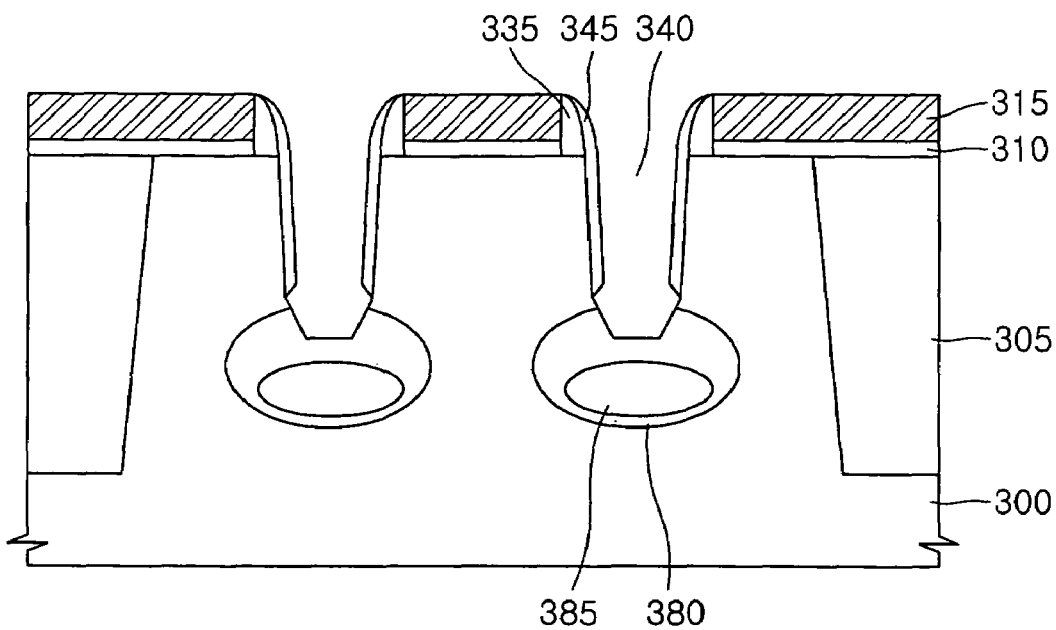

Referring to FIG. 4D, a lower portion of the semiconductor substrate 300 exposed by the recess trench 340 is ion-implanted to sequentially form a local channel impurity doped region 380 and a $V_{th}$ adjusting impurity doped region 385. Therefore, a local recess channel surrounding the recess trench 340 can be independently formed for each transistor.

The $V_{th}$ adjusting impurity doped region 385 is formed inside the local channel impurity doped region 380. The $V_{th}$ adjusting impurity doped region 385 has a higher concentration of the impurity than the local channel impurity doped region 380.

As a result, even when the depths of the recess trenches 340 vary due to, for example, non-uniformity of etching equipment, the local channel impurity doped regions 380 and the $V_{th}$ adjusting impurity doped regions 385 can be formed at predetermined depths below the recess trenches 340 because recess channel impurity ions and the threshold voltage impurity ions are implanted through the semiconductor substrate 300 exposed along the lower portion of the recess trenches 340, not through an upper surface of the semiconductor substrate 300. Therefore, doping concentrations in channel regions can be relatively equal and provide relatively constant threshold voltages for the transistors.

Figure 4E:
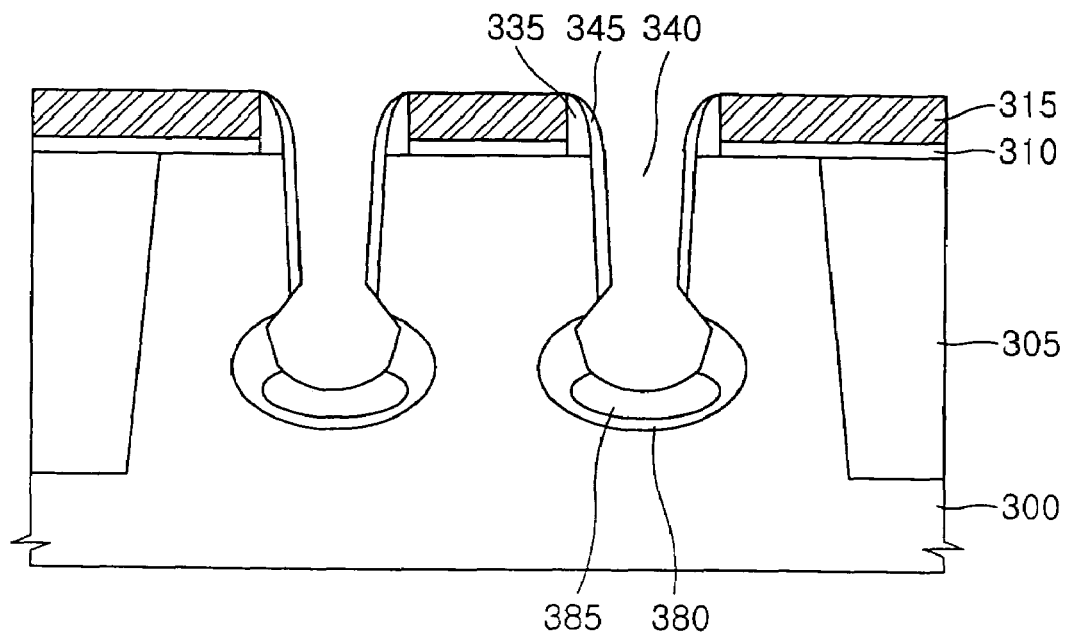

Referring to FIG. 4E, the semiconductor substrate 300 exposed along the lower portion of the recess trench 340 is isotropically etched using the hard mask layer 315 and the trench spacer 345 as an etch mask. As a result, the lower portion of the recess trench 340 expands to be curved and spherical. The isotropic etching may be performed until a portion of the threshold impurity doped region 385 is exposed. The isotropic etching is described above with references to FIG. 3F.

Alternatively, without using an additional photolithography process, the lower portion of the recess trench 340 can be isotropically etched using the trench spacer 345 as an etch mask. In this case, an effective channel length may be increased, and the transistor may be fabricated with lower manufacturing costs and with sufficiently small feature sizes to allow for fabrication of a highly integrated device.

Figure 4F:
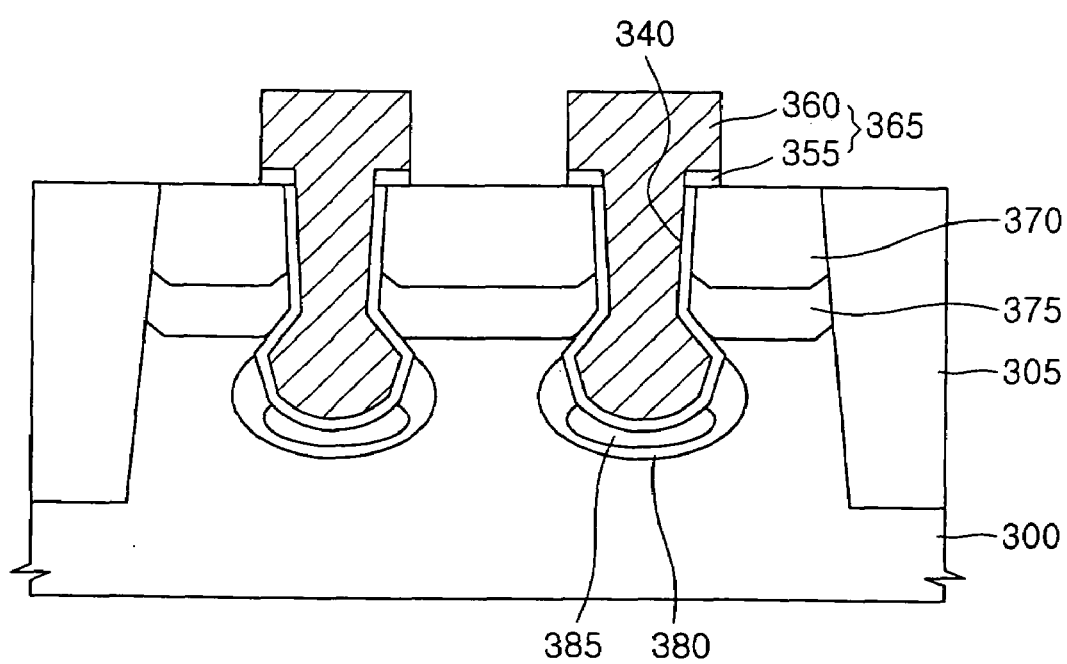

Referring to FIG. 4F, the trench spacer 345, the insulating spacer 335, the hard mask layer 315, and the buffer layer 310 are removed to expose the device isolation region 305 and the semiconductor substrate 300.

A gate 365 is formed by filling the recess trench. The source/drain region 370 and a lightly doped region 375 are formed next to the gate 365. A process for forming the gate 365, the source/drain region 370, and the lightly doped region 375 is described above with reference to FIGS. 3H and 3I. A storage device such as a capacitor, and a metal interconnection layer can be formed using a conventional process, which is not shown in the figures, to form a memory device.

According to the embodiments of FIGS. 4A-F, a local recess channel can be formed because the local channel impurity doped region 380 and the Vth adjusting impurity doped region 385 can be separately formed for each transistor. Therefore, even when the depths of the recess trenches 340 vary, a threshold voltage of the associated transistors may be constant. In addition, the lower portion of the recess trench 340 is isotropically etched to increase the effective channel length, and so that the transistor may be fabricated with lower manufacturing costs and with sufficiently small feature sizes to allow for fabrication of a highly integrated device. Because the local channel impurity doped region 380 and the $V_{th}$ adjusting impurity doped region 385 are formed after the recess trench 340 is formed, ion-implantation for forming the local recess channel can be performed with a low energy, which may thereby decrease the distribution of impurity doped regions 380 and 385.

A local recess channel transistor according to some embodiments of the present invention includes a gate, a local channel impurity doped region, and a $V_{th}$ adjusting impurity doped region. A curved lower portion of the gate of the local recess channel transistor is surrounded by the local channel impurity doped region and the $V_{th}$ adjusting impurity doped region, which are separately formed for each transistor. As a result, even when the gates of the local recess channel transistors have varying recessed depths into a semiconductor substrate, their threshold voltage may be constant because the local channel impurity regions are separately formed and isolated from those of adjacent transistors having a common source/drain region. In contrast, in the conventional recess channel transistors 181a-b, the variation in recessed depths and/or widths of the gates 165a-b may cause a varying concentration of a threshold voltage impurity, and a variation in the threshold voltages of the transistors 181a-b.

In addition, in accordance with some embodiments of the present invention, a lower portion of the gate of the local channel transistor is enlarged to cause an effective channel length that can be longer than that caused by a cylindrical gate.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be within the scope of the invention as defined in the appended claims.

What is claimed is:

1. A semiconductor device comprising:
   a semiconductor substrate;
   first and second local recess channel transistors, each comprising:
   source/drain regions in the substrate;
   a recess trench in the substrate between adjacent source/ regions;
   a gate in the recess trench and extending between a lower portion of the trench and an upper surface of the substrate; and
   a local channel impurity doped region in the substrate below and surrounding lower side portions of the gate in the lower portion of the recess trench, wherein a common one of the source/drain regions extends between the gates of the first and second local recess channel transistors, the common one of the source/ drain regions is doped with a different conductive type impurity than the local channel impurity doped regions, the local channel impurity doped region of the first local recess channel transistor is isolated from the local channel impurity doped region of the second local recess channel transistor, and the common one of the source/drain regions overlies a portion of the substrate that isolates the local channel impurity doped regions of the first and second local recess channel transistors.

2. The semiconductor device of claim 1, wherein:
   the first and second local recess channel transistors each further comprise a threshold voltage ($V_{th}$) adjusting impurity doped region inside the local channel impurity doped region of the substrate; and
   the $V_{th}$ adjusting impurity doped region and the local channel impurity doped region are doped with the same conductive type of impurities.

3. The semiconductor device of claim 1, wherein the lower portion of the gate surrounded by the local channel impurity doped region is wider than an upper portion of the gate.

4. The semiconductor device of claim 1, wherein the common one of the source/drain regions overlaps a portion of the local channel impurity doped region of each of the first and second local recess channel transistors.

5. The semiconductor device of claim 1, wherein each of the first and second local recess channel transistors each further comprise a lightly doped region underlying the source/drain regions, and wherein the lightly doped region underlying the common one of the source/drain regions extends between the gates of the first and second local recess channel transistors and overlies a portion of the substrate that isolates the local channel impurity doped regions of the first and second local recess channel transistors.

6. The semiconductor device of claim 1, wherein an upper surface of the gate protrudes above an upper adjacent major surface of the substrate.

7. The semiconductor device of claim 1, further comprising a gate insulating layer between each of the gates and the recess trench, wherein the local channel impurity doped region directly contacts and surrounds lower portions of the gate insulating layer in the recess trench without any intervening region having opposite conductive type impurities to the local channel impurity doped region.

8. The semiconductor device of claim 2, wherein the $V_{th}$ adjusting impurity doped region has a higher impurity concentration than the local channel impurity doped region of the same conductive type impurities.

9. The semiconductor device of claim 2, wherein:
   the local channel impurity doped region is doped with boron; and
   the $V_{th}$ adjusting impurity doped region is doped with $BF_2$.

10. The semiconductor device of claim 3, wherein the gate has a cylindrical upper portion and a spherical lower portion.

11. The semiconductor device of claim 10, wherein the local channel impurity doped region surrounds at least a portion of the spherical lower portion of the gate.

12. The semiconductor device comprising:
    a semiconductor substrate;
    source/drain regions in the substrate;
    a recess trench in the substrate between adjacent source/ regions;
    a gate electrode in the recess trench and extending between a lower portion of the trench and an upper surface of the substrate;
    a gate insulating layer interposed between the gate electrode and the semiconductor substrate; and
    a local channel impurity doped region in the substrate below and surrounding lower side portions of the gate electrode in the lower portion of the recess trench, wherein the local channel impurity doped region is space apart from the gate electrode by the gate insulating layer to be insulated from the gate electrode and the source/drain regions are doped with a different conductive type impurity than the local channel impurity doped regions.

13. The semiconductor device of claim 12, further comprising a threshold voltage (Vth) adjusting impurity doped region inside the local channel impurity doped region of the substrate; and the Vth adjusting impurity doped region and the local channel impurity doped region are doped with the same conductive type of impurities.

14. The semiconductor device of claim 13, wherein the Vth adjusting impurity doped region has a higher impurity concentration than the local channel impurity doped region of the same conductive type impurities.

* * * * *